(12) United States Patent
Scheuerlein

(10) Patent No.: US 7,351,992 B2
(45) Date of Patent: Apr. 1, 2008

(54) FORMING NONVOLATILE PHASE CHANGE MEMORY CELL HAVING A REDUCED THERMAL CONTACT AREA

(75) Inventor: Roy E. Scheuerlein, Cupertino, CA (US)

(73) Assignee: Sandisk Corporation, Milpitas, CA (US)

( * ) Notice: Subject to any disclaimer, the term of this patent is extended or adjusted under 35 U.S.C. 154(b) by 0 days.

(21) Appl. No.: 11/839,490

(22) Filed: Aug. 15, 2007

(65) Prior Publication Data

US 2007/0272913 A1    Nov. 29, 2007

Related U.S. Application Data

(62) Division of application No. 11/040,465, filed on Jan. 19, 2005, now Pat. No. 7,259,038.

(51) Int. Cl.
*H01L 47/00* (2006.01)
(52) U.S. Cl. .............................. 257/5; 257/41; 257/42
(58) Field of Classification Search ................ 257/2–5, 257/41, 42, E31.029
See application file for complete search history.

(56) References Cited

U.S. PATENT DOCUMENTS

| | | | |
|---|---|---|---|
| 5,915,167 A | 6/1999 | Leedy | |
| 6,034,882 A | 3/2000 | Johnson | |
| RE37,259 E | 7/2001 | Ovshinsky | |
| 6,420,215 B1 | 7/2002 | Knall et al. | |
| 6,525,953 B1 | 2/2003 | Johnson | |
| 6,879,505 B2 | 4/2005 | Scheuerlein | |
| 6,952,043 B2 | 10/2005 | Vyvoda et al. | |
| 7,081,377 B2 | 7/2006 | Cleeves | |
| 7,092,286 B2 | 8/2006 | Lowrey et al. | |
| 7,172,840 B2 | 2/2007 | Chen | |
| 2004/0051094 A1 | 3/2004 | Ooishi | |
| 2005/0052915 A1 | 3/2005 | Herner | |
| 2005/0158950 A1 | 7/2005 | Scheuerlein et al. | |
| 2005/0221200 A1 | 10/2005 | Chen | |
| 2006/0157679 A1 | 7/2006 | Scheuerlein | |
| 2006/0157682 A1 | 7/2006 | Scheuerlein | |
| 2006/0157683 A1 | 7/2006 | Scheuerlein | |

*Primary Examiner*—Thien F Tran
(74) *Attorney, Agent, or Firm*—Vierra Magen Marcus & DeNiro LLP

(57) ABSTRACT

The invention provides for a nonvolatile memory cell comprising a heater layer in series with a phase change material, such as a chalcogenide. Phase change is achieved in chalcogenide memories by thermal means. Concentrating thermal energy in a relatively small volume assists this phase change. In the present invention, a layer in a pillar-shaped section of a memory cell is etched laterally, decreasing its cross-section. In this way the cross section of the contact area between the heater layer and the phase change material is reduced. In preferred embodiments, the laterally etched layer is the heater layer or a sacrificial layer. In a preferred embodiment, such a cell can be used in a monolithic three dimensional memory array.

14 Claims, 12 Drawing Sheets

FORMING NONVOLATILE PHASE CHANGE MEMORY CELL HAVING A REDUCED THERMAL CONTACT AREA

RELATED APPLICATIONS

This is a divisional application of U.S. patent application Ser. No. 11/040,465, filed Jan. 19, 2005 now U.S. Pat. No. 7,259,038, published as US Pub. No. 20060157683 on Jul. 20, 2006, incorporated herein by reference. This application is also related to Scheuerlein, US Pub. No. 2005/0158950, published Jul. 21, 2005 (application Ser. No. 11/040,255, filed Jan. 19, 2005), titled "A Non-Volatile Memory Cell Comprising a Dielectric Layer and a Phase Change Material in Series,"; to Scheuerlein, US Pub. No. 2006/0157679, published Jul. 20, 2006 (application Ser. No. 11/040,262, filed Jan. 19, 2005), titled "Structure and Method for Biasing Phase Change Memory Array for Reliable Writing,"; and to Scheuerlein, US Pub. No. 2006/0157682, published Jul. 20, 2006 (application Ser. No. 11/040,256, filed Jan. 19, 2005), titled "A Write-Once Nonvolatile Phase Change Memory Array,"; all filed on even date herewith and incorporated herein by reference.

BACKGROUND OF THE INVENTION

The invention relates to a nonvolatile memory cell comprising a phase change material to in contact with a heater layer, the contact region of reduced area, and methods to form this heater layer.

Phase-change materials such as chalcogenides have been used in nonvolatile memories. Such materials can exist in one of two or more stable states, for example a high-resistance and a low-resistance state. In chalcogenides, the high-resistance state corresponds to an amorphous state, while the low-resistance state corresponds to a more ordered crystalline state. The conversion between states is generally achieved thermally.

Conversion from one phase to another is achieved most effectively if the thermal energy is focused into a relatively small area. Some prior art devices have tried to focus thermal energy by forming a very small contact area using photolithography. The limits of photolithography, however, restrict the usefulness of this approach. A need exists, therefore, for a method to concentrate heat in a phase change memory in a volume smaller than that easily achievable using photolithography.

SUMMARY OF THE INVENTION

The present invention is defined by the following claims, and nothing in this section should be taken as a limitation on those claims. In general, the invention is directed to a nonvolatile memory cell comprising a phase change element and a heater layer, with a small contact area between the two.

A first aspect of the invention provides for a method for forming a phase change memory cell, the method comprising forming a bottom conductor; forming a top conductor above and vertically separate from the bottom conductor; forming a pillar diode having a diode diameter, the pillar diode disposed between the bottom conductor and the top conductor; forming a heater layer disposed between the pillar diode and the bottom conductor or between the pillar diode and the top conductor; forming a phase change element in contact with the heater layer; forming a laterally etchable layer disposed between the pillar diode and the bottom conductor or between the pillar diode and the top conductor; and laterally etching the laterally etchable layer wherein, after lateral etching, the laterally etchable layer has an etched diameter less than the diode diameter.

A preferred embodiment of the invention provides for a monolithic three dimensional phase change memory array comprising a) a first memory level, the first memory level comprising i) a plurality of substantially parallel first conductors formed at a first height above a substrate; ii) a plurality of substantially parallel second conductors formed at a second height, the second height above the first height; iii) a plurality of first diodes, each disposed between one of the first conductors and one of the second conductors; iv) a plurality of heater layers, each disposed between one of the first conductors and one of the second conductors and each having an upper surface having a first area; v) a plurality of phase change elements, each having a lower surface having a second area, wherein at least a part of the lower surface of each phase change element is in contact with the upper surface of the adjacent heater layer and wherein the first area is smaller than the second area; and b) at least a second memory level monolithically formed on the first memory level.

Another aspect of the invention provides for a method for forming a monolithic three dimensional phase change memory array, the method comprising forming a plurality of substantially parallel, substantially coplanar first conductors at a first height above a substrate; forming a plurality of substantially parallel, substantially coplanar second conductors at a second height above the first height; forming a plurality of first diodes disposed between the first conductors and the second conductors, each first diode having a first average diode diameter; forming a plurality of heater elements, each heater element between one of the first diodes and one of the first conductors or one of the second conductors; forming a plurality of phase change elements, each in contact with one of the heater elements; forming a plurality of laterally etchable elements, each disposed above one of the first diodes, between the one of the first diodes and one of the second conductors; and laterally etching each of the laterally etchable elements wherein, after lateral etching, each laterally etchable element has an etched diameter less than the first average diode diameter of the first diode below it, wherein a phase change memory cell is formed between each of the first conductors and each of the second conductors.

Another preferred embodiment of the invention provides for a method for forming a monolithic three dimensional phase change memory array, the method comprising forming a plurality of substantially parallel, substantially coplanar first conductors at a first height above a substrate; depositing a semiconductor layerstack over the first conductors; depositing a heater layer on the semiconductor layerstack; forming a sacrificial layer on the heater layer; patterning and etching the sacrificial layer, heater layer, and semiconductor layer stack into first pillars, each first pillar comprising a) a first semiconductor diode etched from the semiconductor layer stack; b) a heater element etched from the heater layer, each heater element having a first diameter; and c) a sacrificial region etched from the sacrificial layer, each sacrificial region having a second diameter; further laterally and selectively etching each sacrificial region; filling gaps between the sacrificial regions with dielectric material; etching to remove the sacrificial regions, leaving voids in the dielectric material; forming phase change elements, wherein a portion of each phase change element fills one of the voids; and forming a plurality of substantially parallel, substantially coplanar second conductors above the first pillars.

Yet another aspect of the invention provides for a method for forming a phase change memory cell, the method comprising forming a bottom conductor; forming a top conductor above and vertically separate from the bottom conductor; forming a non-ohmic conductive element disposed between the bottom conductor and the top conductor, the non-ohmic conductive element having a first diameter; forming a heater layer disposed between the non-ohmic conductive element and the bottom conductor or between the non-ohmic conductive element and the top conductor; forming a phase change element in contact with the heater layer; forming a laterally etchable layer disposed between the non-ohmic conductive element and the bottom conductor or between the non-ohmic conductive element and the top conductor; and laterally etching the laterally etchable layer wherein, after lateral etching, the laterally etchable layer has an etched diameter less than the first diameter.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

While all materials can change phase, in this discussion the term "phase change material" will be used to describe a material that changes relatively easily from one stable state to another. The phase change is typically from an amorphous state to a crystalline state (or vice versa), but may be an intermediate change, such as from a less-ordered to a more ordered crystalline state, or vice versa. Chalcogenides are well-known phase change materials.

It is known to use phase change materials, such as chalcogenides, in a nonvolatile memory cell, in which a high-resistance, amorphous state represents one memory state while a low-resistance, crystalline state represents the other memory state, where memory states correspond to a value of 1 or 0. (If intermediate stable states are achieved, more than two memory states can exist for each cell; for simplicity, the examples in this discussion will describe only two memory states.) Chalcogenides are particularly useful examples of phase change materials, but it will be understood that other materials which undergo reliably detectable stable phase changes, such as silicon, can be used instead.

Figure 1:
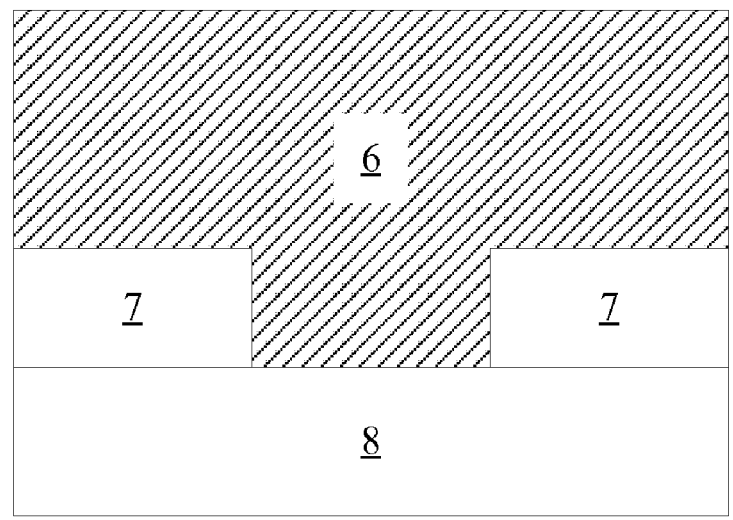
FIG. 1 is a cross-sectional view of a portion of a prior art memory cell.

Phase change material is converted from one state to the other by heating to high temperature. To facilitate this conversion, mechanisms have been used to concentrate heat in a relatively small area contacting the phase change material. For example, as shown in FIG. 1, in some prior art devices, the phase change material 6 is formed with a portion having a narrow cross-section contacting a heater element 8. This structure has been formed by depositing dielectric layer 7, patterning and etching a hole in dielectric layer 7, then depositing the material that forms heater element 8 to fill the hole. In such a scheme, the achievable reduction in area is dictated by the limits of photolithography; i.e., the contact can be no smaller than the minimum feature size that can be patterned and etched. This approach also calls for relatively precise alignment.

The present invention takes a different approach to forming a small contact area between a heater layer and a phase change material, allowing formation of a contact area smaller than the minimum feature size that can easily be formed by pattern and etch, with no precise alignment required.

Figure 2A:
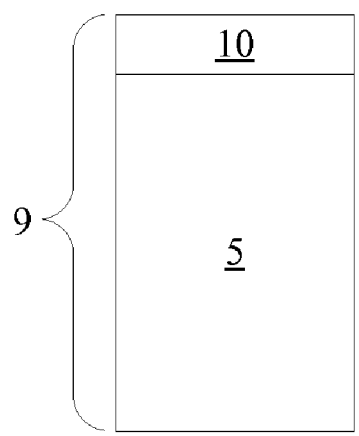
FIGS. 2a-2b are cross-sectional views illustrating stages of fabrication of a memory cell according to an embodiment of the present invention.
Figure 2B:
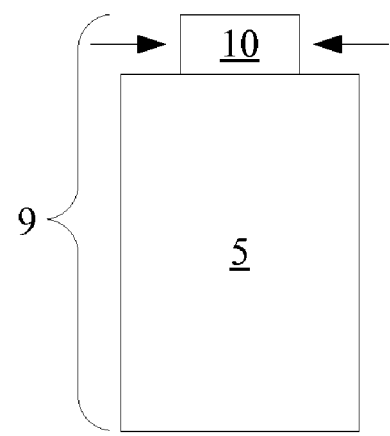

In the present invention, either the heater layer or a volume of the phase change area adjacent to the heater layer has a narrow cross section, concentrating the applied thermal energy. Turning to FIG. 2a, first a pillar-shaped cell or portion of a cell 9 is patterned and etched. Element 5 is preferably an isolation device, such as a diode. Next a selective lateral etch reduces the cross-section of portion 10 of the pillar, as shown in FIG. 2b. Narrowed section 10 can have a diameter smaller than the smallest feature size achievable using photolithographic methods. Narrowed section 10 can comprise material that makes up the heater layer, the phase change material, or a sacrificial material that will not be a part of the finished device.

Figure 3A:
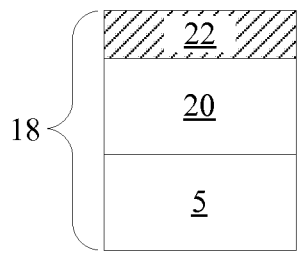
FIGS. 3a-3e are cross-sectional views illustrating stages of fabrication of a memory cell according to an embodiment of the present invention, the embodiment including lateral etch of a sacrificial layer.
Figure 3B:
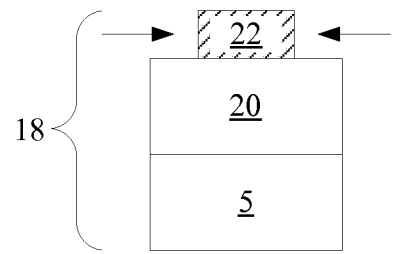
Figure 3C:
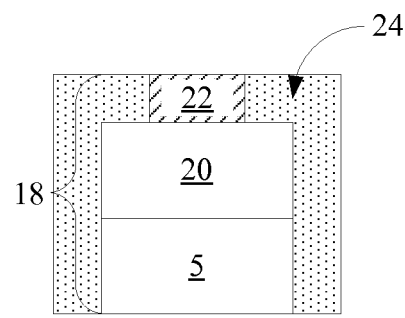

This technique can be used in a variety of ways to form a nonvolatile phase change memory cell. In one aspect of the invention, shown in FIG. 3a, a pillar 18, including diode 5, heater layer 20, and sacrificial layer 22, is patterned and etched. In FIG. 3b, sacrificial layer 22 is laterally etched (etch direction indicated by arrows) to form a cross-sectional area narrower than that of adjacent heater layer 20. As shown in FIG. 3c, dielectric fill material 24 surrounds and covers pillar 18, and a planarization step exposes the top of sacrificial layer 22.

Figure 3D:
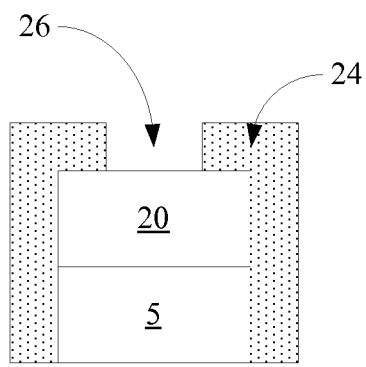
Figure 3E:
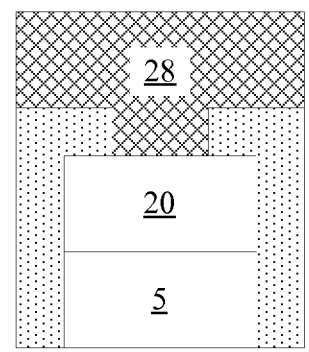

Next, as in FIG. 3d, a selective etch removes sacrificial layer 22, creating void 26. Finally, as shown in FIG. 3e, phase change element 28 is deposited, filling void 26. Phase change element 28 has a narrow cross-section area in contact with heater layer 20.

Figure 4A:
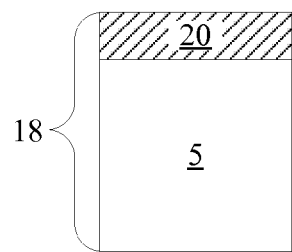
FIGS. 4a-4d are cross-sectional views illustrating stages of fabrication of a memory cell according to an embodiment of the present invention, the embodiment including lateral etch of a heater layer.
Figure 4B:
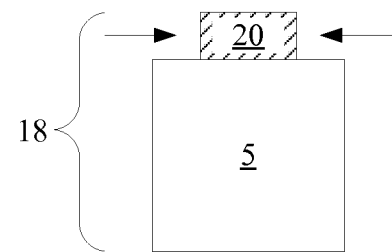
Figure 4C:
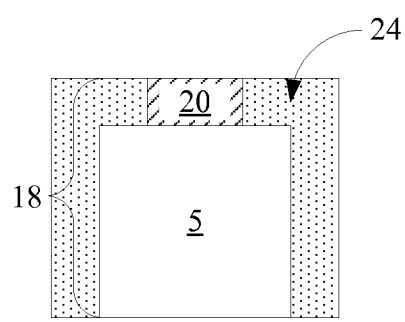

Turning to FIG. 4a, in a different aspect of the invention, a pillar 18 is formed, again including diode 5 and heater layer 20, but with no sacrificial layer. In FIG. 4b, heater layer 20 is laterally etched (etch direction indicated by arrows) to form a cross-sectional area narrower than that of diode 5. A dielectric fill material 24 surrounds and covers pillar 18, and a planarization step exposes the top of heater layer 20, as shown in FIG. 4c. Finally, as shown in FIG. 4d, phase change element 28 is deposited on pillar 18, contacting narrow cross-section heater layer 20.

Figure 5A:
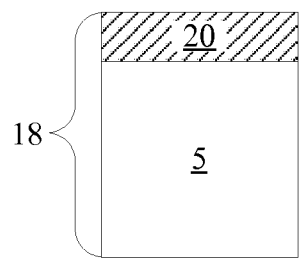
FIGS. 5a-5d are cross-sectional views illustrating stages of fabrication of a memory cell according to an embodiment of the present invention, the embodiment including nonselective lateral etch of a sacrificial layer.
Figure 5B:
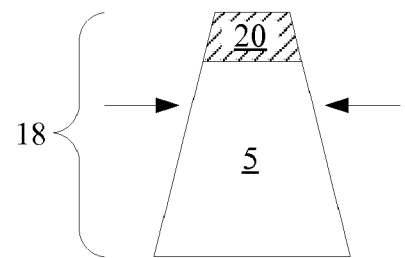

In yet another embodiment, FIG. 5a begins with a pillar 18 including diode 5 and a heater layer 20. A relatively isotropic, nonselective etch laterally etches the entire pillar 18, including heater layer 20. Etches are performed from the top down, so material at the top of pillar 18 is exposed to etchant longer, and is thus etched more, than material at the bottom. As can be seen in FIG. 5b, then, pillar 18 narrows toward the top.

Figure 5C:
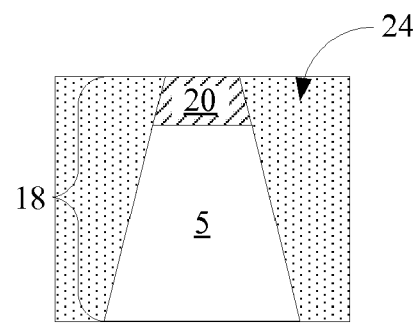

Turning to FIG. 5c, dielectric fill 24 surrounds pillar 18, and a planarization step exposes the top of heater layer 20. Finally, as shown in FIG. 5d, phase change element 28 is deposited on pillar 18, contacting narrow cross-section heater layer 20.

Figure 4D:
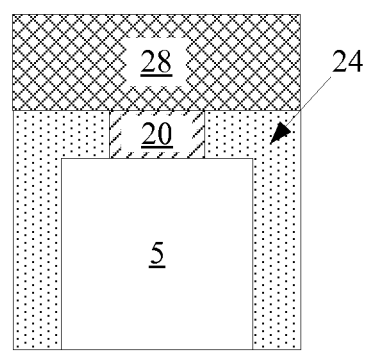
Figure 5D:
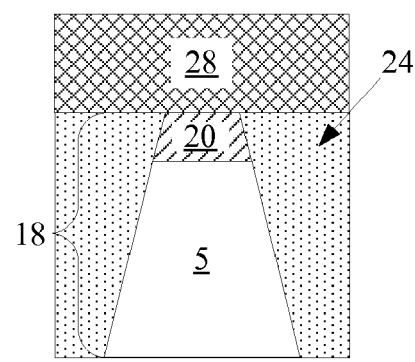

The examples shown in FIGS. 3e, 4d, and 5d are just three possible ways in which nonvolatile memory cells including a reduced area contact between a heater layer and a phase change layer can be formed according to the present invention; clearly many other configurations are possible. For example, embodiments can be intermediate between 4d and 5d, with varying etch selectivity between heater layer 18 and the rest of the pillar. In another possible variation, in the embodiments just described, if appropriate etch chemistries are used, the location of the heater layer and the phase change material can be reversed. The common element in these methods is the use of a lateral etch to reduce the cross section of the contact region between the heater material and the phase change material.

In the examples of FIGS. 3e, 4d, and 5d, the memory cells just described includes a diode. A diode is a non-ohmic conductive element, and serves as an isolation device. A non-ohmic conductive element is characterized by a non-linear current vs. voltage curve. Other non-ohmic elements may be used in place of the diode 5. For example, a metal-insulator-metal device consists of two metal (or metal-like) layers separated by a very thin insulator layer. When sufficient voltage is applied, charge carriers can tunnel across the insulator layer, but do not permanently damage it, as in an antifuse. In alternative embodiments of the present invention, the diode 5 of memory cells of FIGS. 3e, 4d, and 5d could be replaced with a MIM device.

To summarize, what has been described is a method for forming a phase change memory cell, the method comprising forming a bottom conductor; forming a top conductor above and vertically separate from the bottom conductor; forming a non-ohmic conductive element disposed between the bottom conductor and the top conductor, the non-ohmic conductive element having a first diameter; forming a heater layer disposed between the non-ohmic conductive element and the bottom conductor or between the non-ohmic conductive element and the top conductor; forming a phase change element in contact with the heater layer; forming a laterally etchable layer disposed between the non-ohmic conductive element and the bottom conductor or between the non-ohmic conductive element and the top conductor; and laterally etching the laterally etchable layer wherein, after lateral etching, the laterally etchable layer has an etched diameter less than the first diameter. The non-ohmic conductive element can be, for example, a diode or a MIM device. In some embodiments, the laterally etchable layer is a heater layer, in others it may be a sacrificial layer, and in still others it may be a phase change layer.

A detailed example will be provided describing fabrication of a monolithic three dimensional memory array, the nonvolatile memory cells of the array formed according to preferred embodiments of the present invention. Formation of two embodiments will be described. For completeness, specific process conditions, dimensions, methods, and materials will be provided. It will be understood, however, that these details are not intended to be limiting, and that many of these details can be modified, omitted or augmented while the results still fall within the scope of the invention.

Fabrication

Fabrication of a single memory level will be described in detail. Additional memory levels can be stacked, each monolithically formed above the one below it.

Figure 6A:
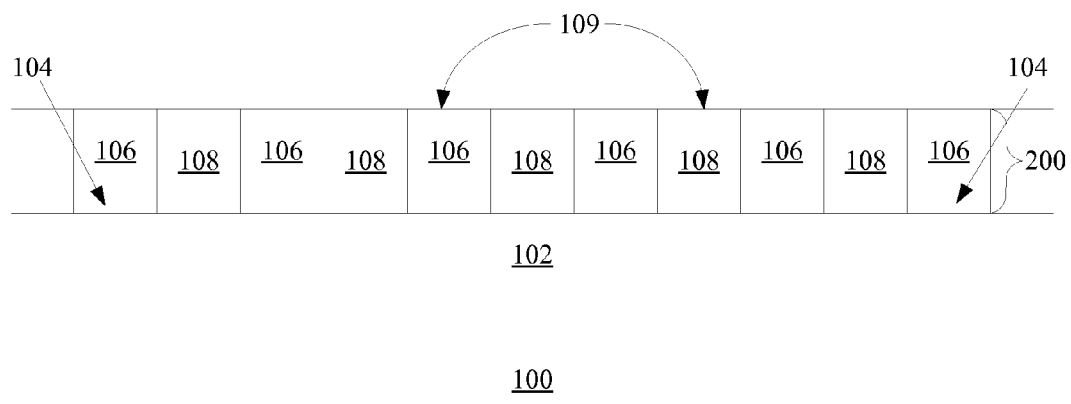
FIGS. 6a-6e are cross-sectional views illustrating stages of fabrication of a memory cell according to an embodiment of the present invention, the embodiment involving lateral etch of a sacrificial layer.

Turning to FIG. 6a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate and insulator. An adhesion layer 104 may be included between the insulating layer 102 and the conducting layer 106 to help the conducting layer 106 adhere. Preferred materials for the adhesion layer 104 are tantalum nitride, tungsten nitride, titanium tungsten, tungsten, titanium nitride, or combinations of these materials. If the overlying conducting layer is tungsten, titanium nitride is preferred as an adhesion layer.

The next layer to be deposited is conducting layer 106. Conducting layer 106 can comprise any conducting material known in the art, including tantalum, titanium, tungsten, copper, cobalt, or alloys thereof. Titanium nitride may be used.

Once all the layers that will form the conductor rails have been deposited, the layers will be patterned and etched using any suitable masking and etching process to form substantially parallel, substantially coplanar conductors 200, shown in FIG. 6a in cross-section. In one embodiment, photoresist is deposited, patterned by photolithography and the layers etched, and then the photoresist removed using standard process techniques.

Next a dielectric material 108 is deposited over and between conductor rails 200. Dielectric material 108 can be any known electrically insulating material, such as silicon oxide, silicon nitride, or silicon oxynitride. In a preferred embodiment, silicon oxide is used as dielectric material 108.

Finally, excess dielectric material 108 on top of conductor rails 200 is removed, exposing the tops of conductor rails 200 separated by dielectric material 108, and leaving a substantially planar surface 109. The resulting structure is shown in FIG. 6a. This removal of dielectric overfill to form planar surface 109 can be performed by any process known in the art, such as chemical mechanical planarization (CMP) or etchback. At this stage, a plurality of substantially parallel first conductors have been formed at a first height above substrate 100.

The first conductors were formed by depositing a first conductive material; and patterning and etching the first conductive material into rail-shaped bottom conductors. The conductors could have been formed by a Damascene method instead.

Figure 6B:
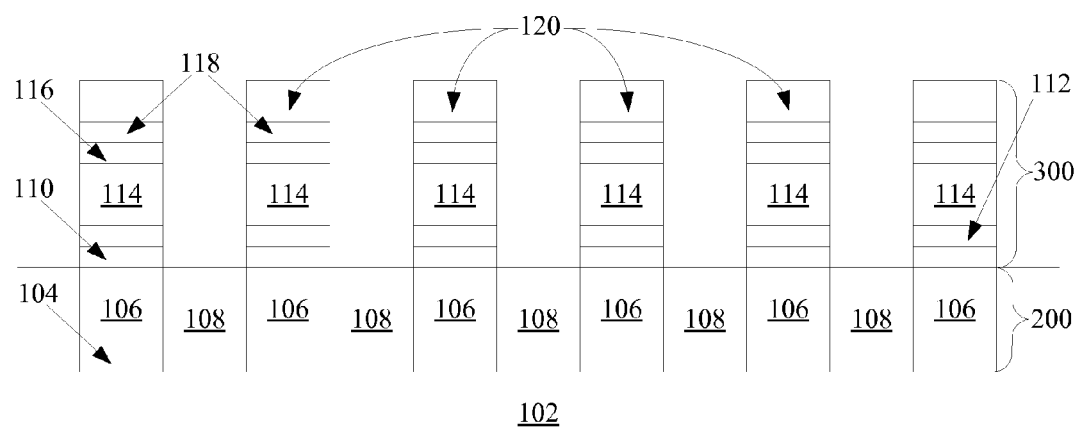

Next, turning to FIG. 6b, vertical pillars will be formed above completed conductor rails 200. (To save space substrate 100 is not shown in FIG. 6b; its presence will be assumed.) Preferably a barrier layer 110 is deposited as the first layer after planarization of the conductor rails. Any suitable material can be used in the barrier layer, including tungsten nitride, tantalum nitride, titanium nitride, or combinations of these materials. In a preferred embodiment, titanium nitride is used as the barrier layer. Where the barrier layer is titanium nitride, it can be deposited in the same manner as the adhesion layer 104 described earlier.

Next semiconductor material that will be patterned into pillars is deposited. The semiconductor material can be silicon, silicon-germanium, silicon-germanium-carbon, germanium, or other suitable semiconductors or compounds. For simplicity, this description will refer to the semiconductor material as silicon, but it will be understood that other suitable materials may be substituted.

Figure 8:
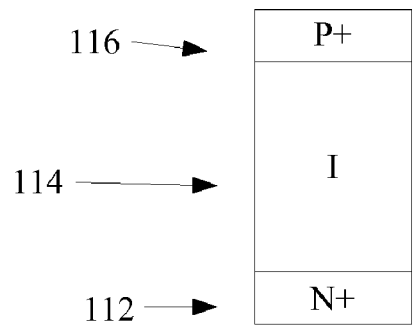
FIG. 8 is a cross-sectional view of an exemplary diode that may be present in a memory cell formed according to the present invention.

In preferred embodiments, the pillar comprises a semiconductor junction diode. Turning to FIG. 8, a preferred junction diode has a bottom heavily doped region 112, intrinsic region 114, and top heavily doped region 116. The conductivity type of bottom region 112 and top region 116 are opposite: Either region 112 is p-type while region 116 is n-type, or region 112 is n-type while region 116 is p-type. Middle region 114 is intrinsic, or not intentionally doped, though in some embodiments it may be lightly doped. An undoped region will never be perfectly electrically neutral, and will always have defects or contaminants that cause it to behave as if slightly n-doped or p-doped. Such a diode can be considered a p-i-n diode.

In FIG. 8, and in the exemplary array, bottom region 112 will be n-type while top region 116 is p-type. It will be understood that these conductivity types could be reversed. To form the diode of FIG. 5, bottom heavily doped region 112 can be formed by any deposition and doping method known in the art. The silicon can be deposited and then doped, but is preferably doped in situ by flowing a donor gas providing n-type dopant atoms, for example phosphorus, during deposition of the silicon. The thickness of bottom heavily doped region 112 is preferably between about 100 and about 1000 angstroms.

The next layer 114 will be intrinsic undoped silicon. This layer can be formed by any deposition method known in the art. The thickness of the intrinsic silicon layer can range from about 1000 to about 4000 angstroms, preferably about 2500 angstroms. In one embodiment, silicon is deposited without intentional doping, yet has defects which render it slightly n-type.

Above this is a layer 116 of heavily doped p-type silicon. This layer is doped by in situ doping or by ion implantation. The thickness of heavily doped p-type silicon region 116 preferably ranges from about 100 to about 400 angstroms.

Pillars and Phase Change Elements

First Embodiment

Returning to FIG. 6b, next a heater layer 118 will be formed on layer 116. The heater layer should be formed of a relatively low thermal conductivity material. In preferred embodiments, heater layer 118 is formed of a refractory metal compound. Suitable materials for heater layer 118 would be any conductor having sheet resistance preferably between about 100 kiloOhm/□ and about 1 kiloOhm/□. Examples are titanium nitride, tungsten nitride, tantalum nitride, titanium silicide, tungsten silicide, tantalum silicide, titanium silicon nitride, tungsten silicon nitride, and tantalum silicon nitride. In this example, layer 118 is formed of titanium nitride.

A sacrificial layer 120 will be formed on heater layer 118. The sacrificial layer should be formed of a material that has good etch selectivity with titanium nitride, silicon and with the dielectric material that will fill gaps between the pillars that are to be formed. Examples of materials suitable for use in the sacrificial layer are magnesium oxide, silicon nitride, silicon, or a silicide. Metal silicides are preferred, including titanium silicide, nickel silicide, or tungsten silicide. If titanium silicide is used, it can be formed by depositing a thin layer of silicon, followed by a thin layer of titanium. A subsequent anneal will form titanium silicide layer 120.

Next, sacrificial layer 120, heater layer 118, semiconductor layers 116, 114 and 112, and underlying barrier layer 110 will all be patterned and etched to form pillars 300. Pillars 300 should have about the same pitch and about the same width as conductors 200 below, such that each pillar 300 is formed on top of a conductor 200. Some misalignment can be tolerated. The structure at this point is shown in FIG. 6b.

The pillars 300 can be formed using any suitable masking and etching process. For example, photoresist can be deposited, patterned using standard photolithography techniques, and etched. The patterning of the pillars 300 could also include forming a hard mask layer such as silicon nitride on top of layer 118, etching the hard mask with the photoresist pattern, then using the patterned hard mask material to etch the pillar.

Figure 6C:
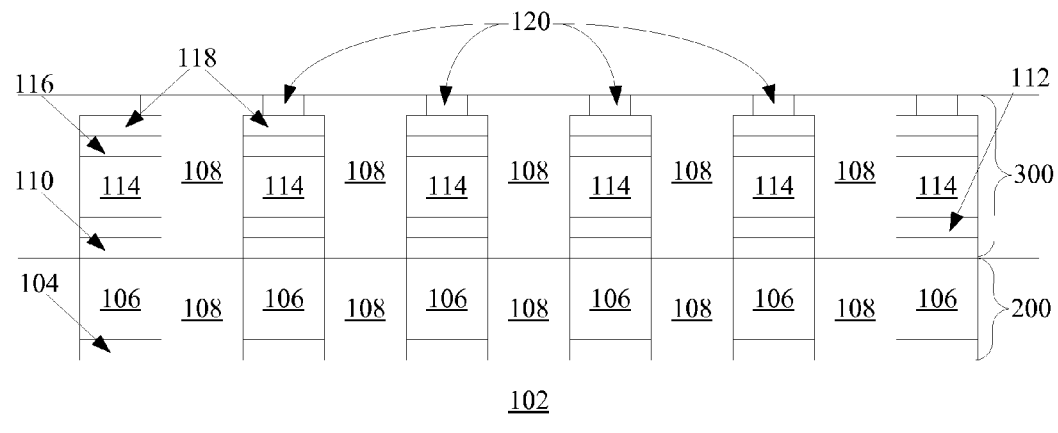

After formation of the pillars, preferably while the photoresist or hard mask layer remains on the pillars, another etch is performed. This next etch is a relatively isotropic etch, which selectively etches the material of sacrificial layer 120, in this case titanium silicide, while etching the other materials of the pillar, in this example silicon and titanium nitride, and the hard mask layer if present, much more slowly or not at all. As shown in FIG. 6c, the effect of this etch is to laterally etch layer 120, decreasing its cross section relative to the other layers of pillar 300. The thickness of layer 120 will be decreased by this etch as well.

Dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide is used as the insulating material.

Next the dielectric material on top of the pillars 300 is removed, exposing the sacrificial layers 120 separated and surrounded by dielectric material 108, and leaving a substantially planar surface. This removal of dielectric overfill can be performed by any process known in the art, such as CMP or etchback. The resulting structure is shown in FIG. 6c.

Figure 6D:
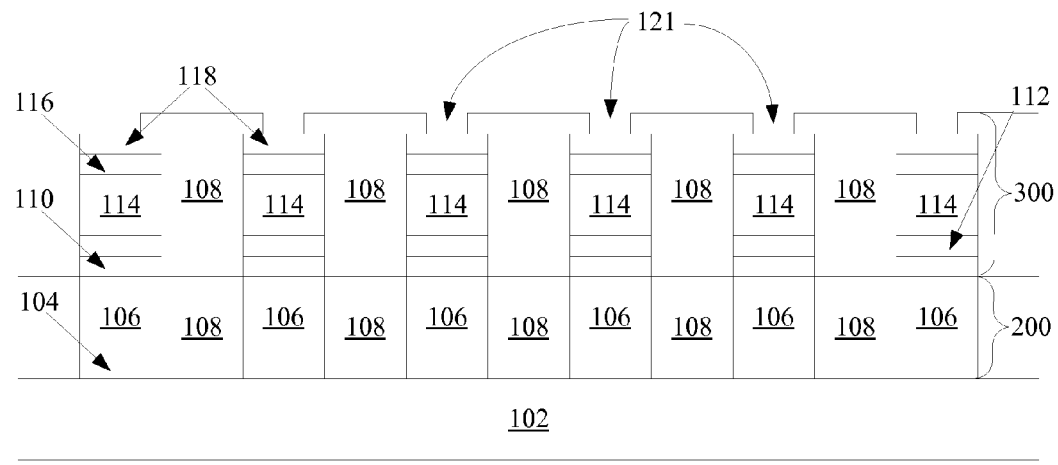

Turning to FIG. 6d, next a selective etch is performed which removes sacrificial layers 120, leaving voids 121.

Figure 6E:
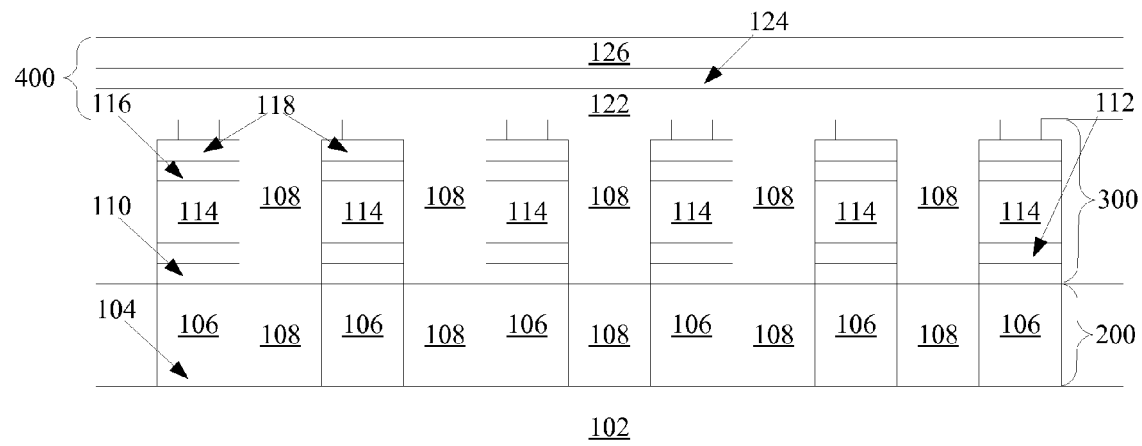

Turning to FIG. 6e, a layer 122 of a phase change material, preferably a chalcogenide material, is formed. A first volume of phase change material 122 fills each void, while a second volume is deposited on the first volume. The first and second volume are most likely deposited in a single deposition step. Layer 118 will serve as a heater layer, heating a portion of phase change layer 122 to cause it to undergo a desired phase change. Layer 122 can be any chalcogenide material, for example any suitable compound of germanium (Ge), antimony (Sb) and tellurium (Te); such a compound is referred to as a GST material. A GST material that may advantageously be employed in memory applications, as in memory cells formed according to the present invention, is $Ge_2Sb_2Te_5$. Phase change layer 122 can be formed by an conventional method.

In preferred embodiments a thin barrier layer 124 is formed on phase change layer 122. Barrier layer 124 provides a barrier between phase change layer 122 and conductive layer 126. Conductive layer 126 is formed of a conductive material, for example tungsten or titanium tungsten.

Phase change material layer 122, barrier layer 124, and conductive layer 126 are then patterned and etched using any suitable masking and etching process to form substantially parallel, substantially coplanar conductors 400, shown in FIG. 6e extending left-to-right across the page. Conductors 400 are preferably substantially perpendicular to lower conductors 200. In one embodiment, photoresist is deposited, patterned by photolithography and the layers etched, and then the photoresist removed using standard process techniques.

Next a dielectric material (not shown) is deposited over and between conductor rails 400. The dielectric material can be any known electrically insulating material, such as silicon oxide, silicon nitride, or silicon oxynitride. In a preferred embodiment, silicon oxide is used as this dielectric material.

Pillars and Phase Change Elements

Second Embodiment

An alternative embodiment will be described, in which the heater layer, rather than a sacrificial layer, is laterally etched to reduce the contact area between the heater layer and the phase change material.

Figure 7A:
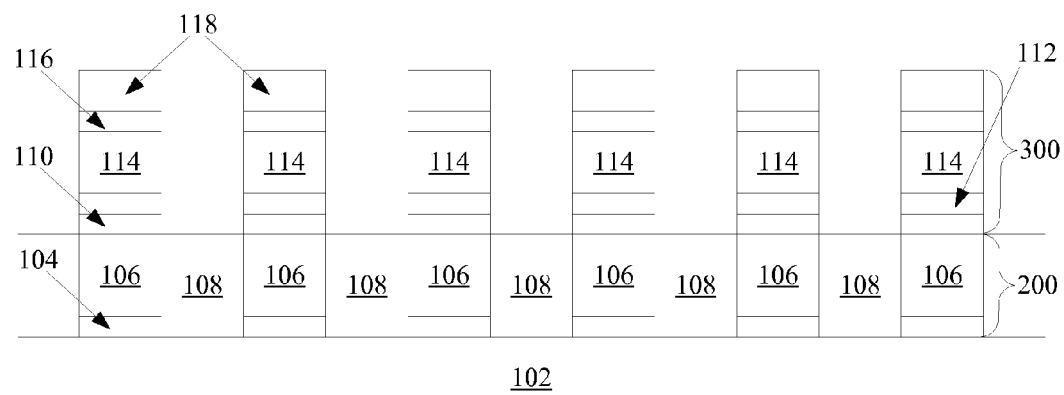
FIGS. 7a-7c are cross-sectional views illustrating stages of fabrication of a memory cell according to an embodiment of the present invention, the embodiment involving lateral etch of the heater layer.

Turning to FIG. 7a, first conductors 200, barrier layer 110, and semiconductor layers 112, 114, and 116 are all formed as in the previous embodiment. Next a heater layer 118 will be formed on layer 116. The heater layer should be formed of a relatively low thermal conductivity material. In preferred embodiments, heater layer 118 is formed of a refractory metal compound. Examples are titanium nitride, tungsten nitride, and tantalum nitride. In this example, layer 118 is formed of titanium nitride.

Heater layer 118, semiconductor layers 116, 114 and 112, and underlying barrier layer 110 will all be patterned and etched to form pillars 300. Pillars 300 should have about the same pitch and about the same width as conductors 200 below, such that each pillar 300 is formed on top of a conductor 200. Some misalignment can be tolerated. The structure at this point is shown in FIG. 7a.

The pillars 300 can be formed using any suitable masking and etching process. For example, photoresist can be deposited, patterned using standard photolithography techniques, and etched, then the photoresist removed. In both preferred embodiments, the step of forming the pillar diodes 300 comprises forming a semiconductor layer stack and patterning and etching the semiconductor layer stack to form the pillar diodes.

Figure 7B:
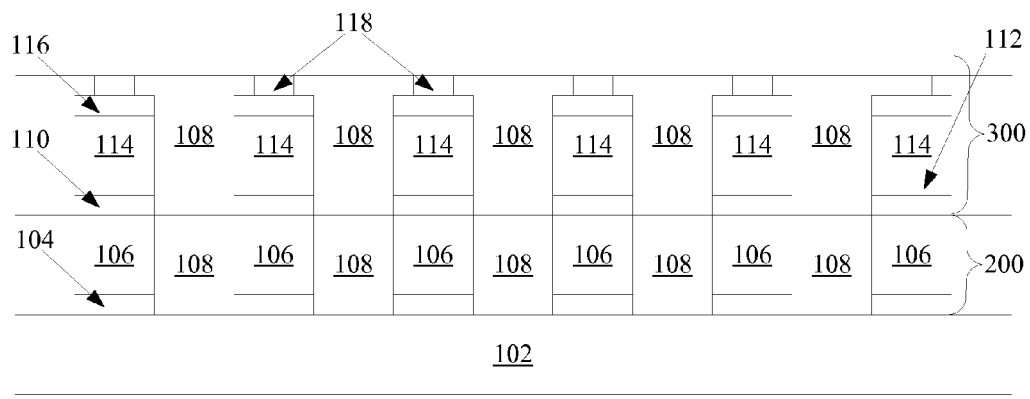

Turning to FIG. 7b, after pillars 300 have been formed, an additional selective etch can be formed that will selectively and laterally etch heater layer 118, narrowing its cross section, while minimally etching the other layers in pillars 30. If titanium nitride was selected for both heater layer 118 and barrier layer 110, it may be preferred to perform the lateral etch of heater layer 118 at a point when pillars 300 are only partially etched, and heater layer 110 is not yet exposed (so that it will not also experience lateral etching.) The remaining height of the pillars is then etched.

Dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide is used as the insulating material.

Next the dielectric material on top of the pillars 300 is removed, exposing the heater layers 118 separated by dielectric material 108, and leaving a substantially planar surface. This removal of dielectric overfill can be performed by any process known in the art, such as CMP or etchback. The resulting structure is shown in FIG. 7b.

Figure 7C:
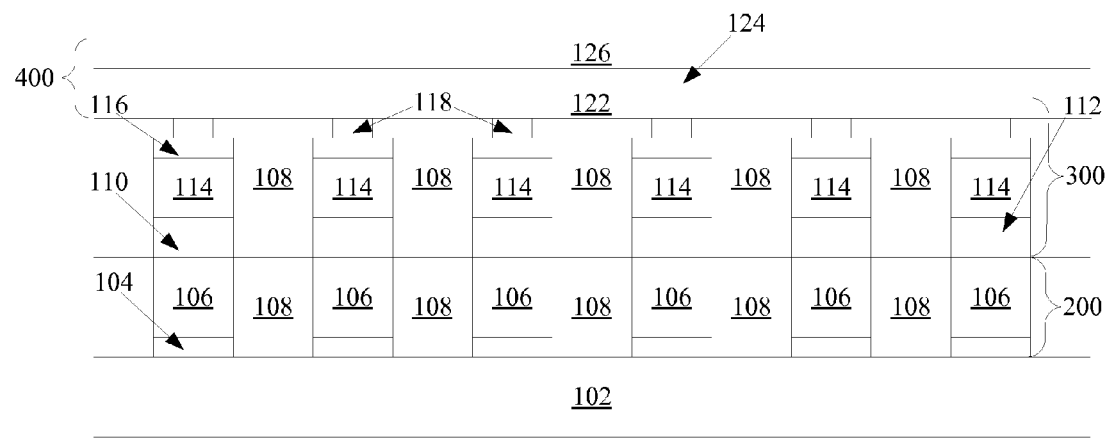

Turning to FIG. 7c, a layer 122 of a phase change material, preferably a chalcogenide material, is formed on the heater layers 120 and intervening dielectric material 108. Layer 122 can be any chalcogenide material, for example any suitable compound of germanium (Ge), antimony (Sb) and tellurium (Te); such a compound is referred to as a GST material. A GST material that may advantageously be employed in memory applications, as in memory cells formed according to the present invention, is $Ge_2Sb_2Te_5$. Phase change layer 122 can be formed by an conventional method.

In preferred embodiments a thin barrier layer 124 is formed on phase change layer 122. Barrier layer 124 provides a barrier between phase change layer 122 and conductive layer 126. Conductive layer 126 is formed of a conductive material, for example tungsten or titanium tungsten.

Phase change material layer 122, barrier layer 124, and conductive layer 126 are then patterned and etched using any suitable masking and etching process to form substantially parallel, substantially coplanar conductors 400, shown in FIG. 7c extending left-to-right across the page. In one embodiment, photoresist is deposited, patterned by photolithography and the layers etched, and then the photoresist removed using standard process techniques.

Next a dielectric material (not shown) is deposited over and between conductor rails 400. The dielectric material can be any known electrically insulating material, such as silicon oxide, silicon nitride, or silicon oxynitride. In a preferred embodiment, silicon oxide is used as this dielectric material.

Figure 9A:
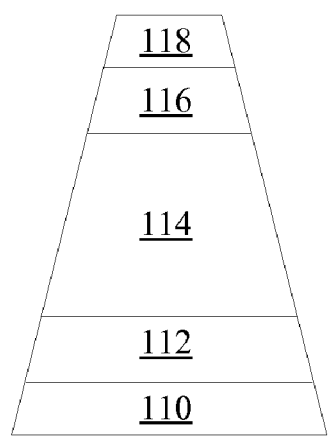
FIGS. 9a and 9b are cross-sectional views illustrating variations on the embodiment of FIGS. 7a-7c with different degrees of etch selectivity during the lateral etch.

FIG. 9a shows another view of a pillar 300 like the one just described having a narrowed heater layer 118 as in FIG.

Figure 9B:
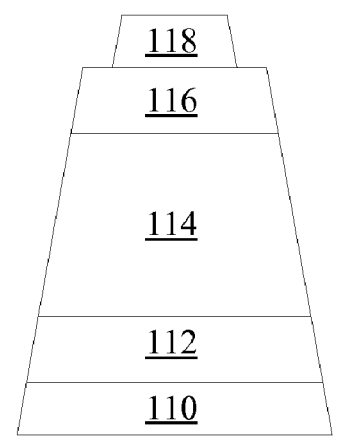

7c. Alternatively, the isotropy of the etch that formed pillars 300 can be carefully controlled to create a tapered pillar 300, as shown in FIG. 9a, with essentially no step between heater layer 118 and the underlying layers. A tapered shape like that of pillar 300 in FIG. 9a is a natural consequence of an etch which is at least partially isotropic, since the material at the top of the etched shape is exposed to the etchant longer than the material at the bottom, and thus will be etched further. Depending on the etchants selected, intermediate degrees of tapering and step may occur; an example is shown in FIG. 9b.

Additional Memory Levels

FIGS. 6e and 7c each show a first memory level. Additional memory levels can be monolithically formed above this memory level to form a monolithic three dimensional memory array. A monolithic three dimensional memory array is one in which multiple memory levels are formed above a single substrate, such as a wafer, with no intervening substrates. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

Figure 10A:
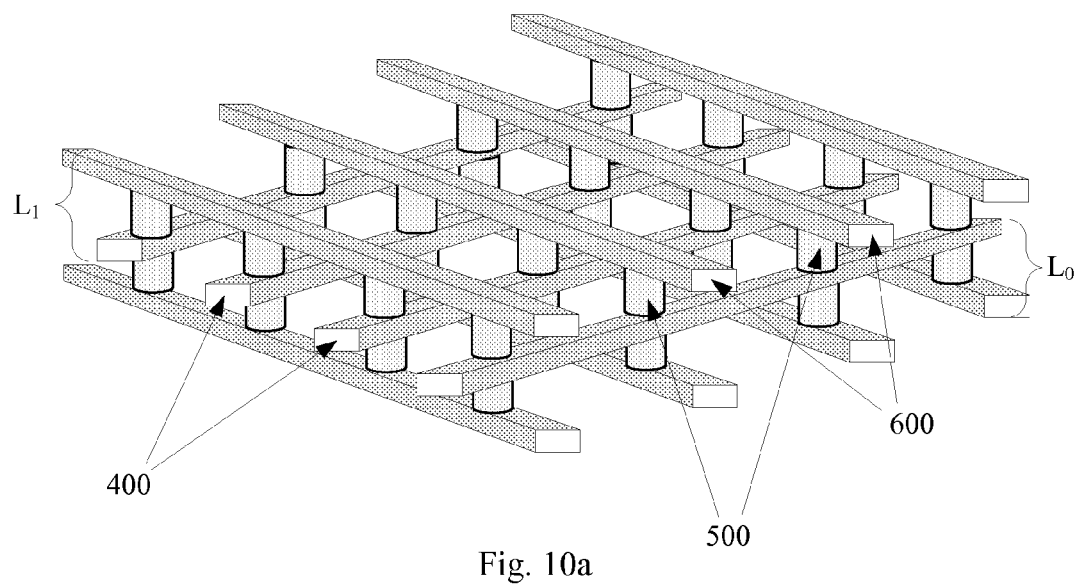
FIG. 10a is a perspective view of stacked memory levels with conductors shared between adjacent memory levels according to a preferred embodiment of the present invention.

A second memory level can be formed above the first memory level just described. In one configuration, top conductors 400 can be shared between adjacent memory levels. Turning to FIG. 10a, if top conductors 400 are to be shared, after planarization second pillars 500 are formed in the same manner as were the first pillars 300, each on one of the conductors 400. A third plurality of substantially parallel, substantially coplanar conductors 600, preferably substantially perpendicular to second conductors 400, are formed above second pillars 500. It will be seen that conductors 400 belong to both memory level $L_0$ and to memory level $L_1$. In this case, in preferred embodiments, the p-i-n diodes in the second pillars 500 may be upside down relative to the p-i-n diodes of first pillars 300; eg if, in first pillars 300, the bottom heavily doped region is n-type and the top heavily doped region is p-type, then in second pillars 500 the bottom heavily doped region may be p-type while the top heavily doped region is n-type. In other embodiments, though, the diodes of both pillars 300 and of pillars 500 may be formed with the same polarity, "pointing" the same direction.

Figure 10B:
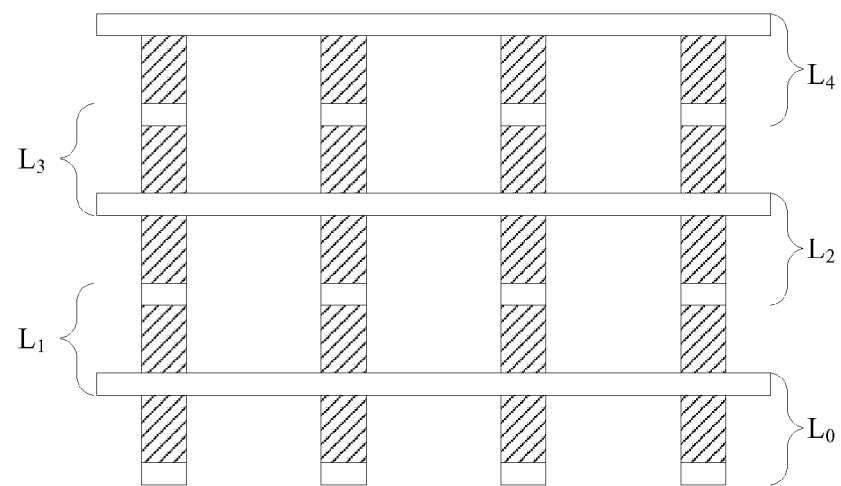
FIG. 10b is a cross-sectional view of several stacked memory levels of such an array.

FIG. 10b shows five memory levels in cross section, illustrating how this scheme can be extended for several stacked levels. One plurality of conductors is shared between $L_0$ and $L_1$, a different plurality of conductors is shared between $L_1$ and $L_2$, etc. In this scheme, each of the second pillars 500 (the pillars comprising diodes) is disposed between one of the second conductors 400 and one of the third conductors 600.

Figure 11A:
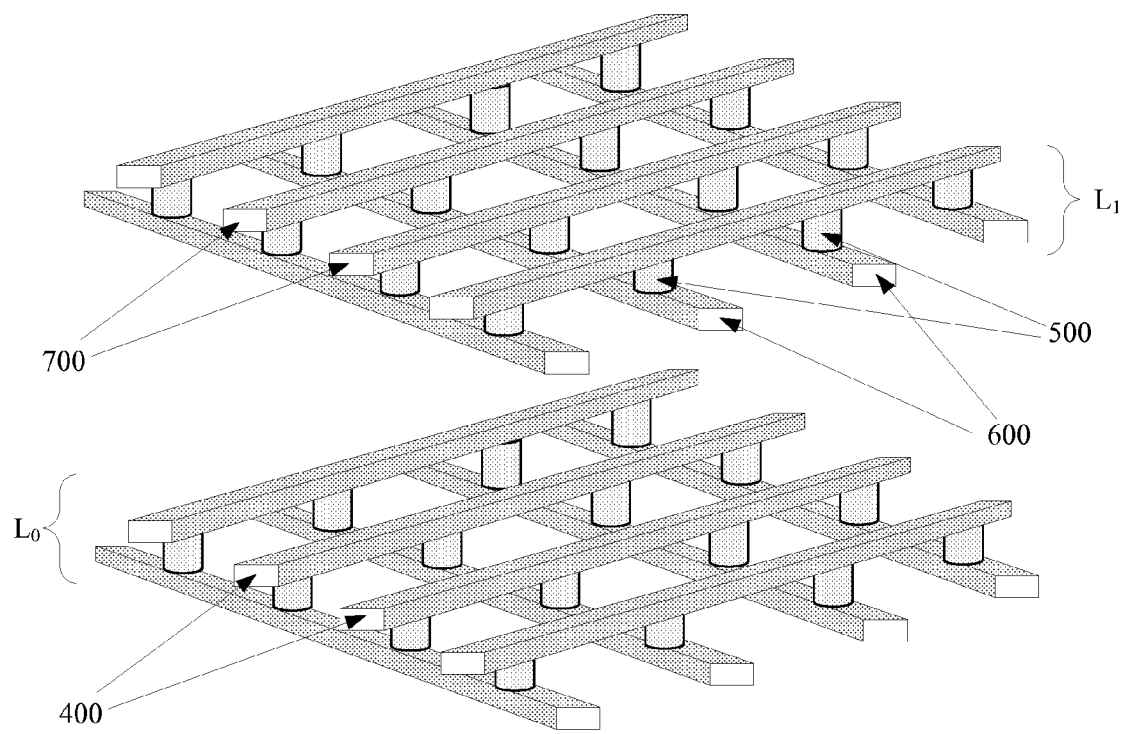
FIG. 11a is a perspective view of stacked memory levels with conductors not shared between adjacent memory levels according to a preferred embodiment of the present invention.
Figure 11B:
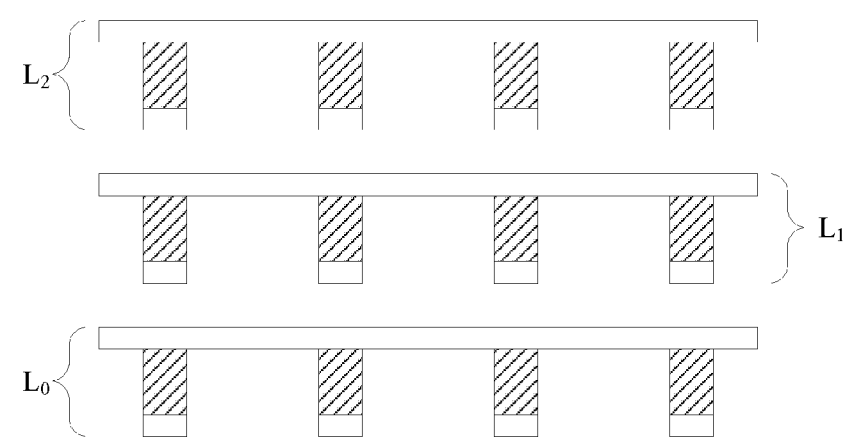
FIG. 11b is a cross-sectional view of several stacked memory levels of such an array.

Alternatively, turning to FIG. 11a, an interlevel dielectric (not shown) can be formed between adjacent memory levels. In this case third conductors 600 are formed above the interlevel dielectric, second pillars 500 formed above third conductors 600, and fourth conductors 700 formed above second pillars 500. Conductors 400 belong to memory level $L_0$ only, while conductors 600 and 700 belong to memory level $L_1$. No conductors are shared between memory levels. FIG. 11b shows a cross-sectional view of an array in which this scheme is extended for three memory levels. No conductors are shared between memory levels $L_0$ and $L_1$, or between memory levels $L_1$ and $L_2$. If desired, adjacent memory levels sharing conductors and adjacent memory levels not sharing conductors can be stacked in the same monolithic three dimensional memory array. In this scheme, each of the second pillars 500 (the pillars comprising diodes) is disposed between one of the third conductors 600 and one of the fourth conductors 700.

Figure 12A:
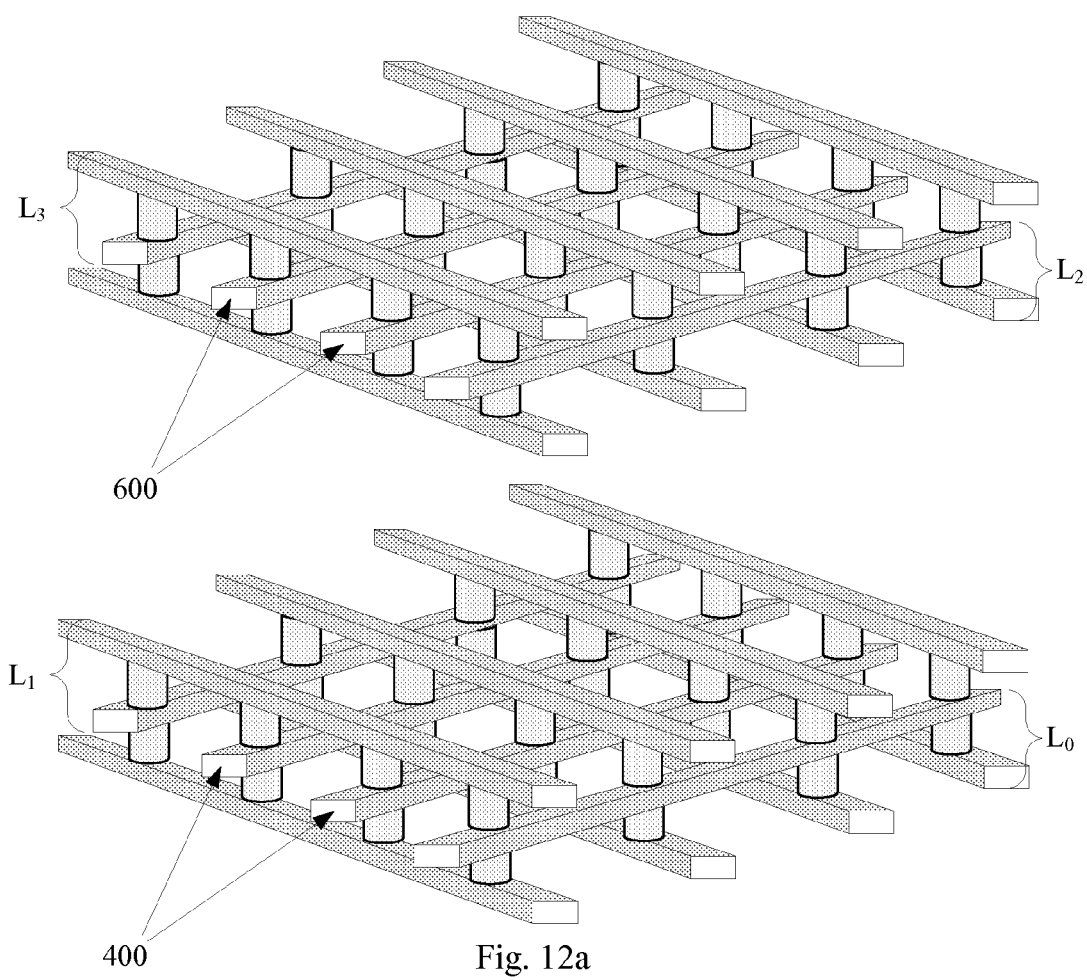
FIG. 12a is a perspective view of stacked memory levels with conductors shared between some adjacent memory levels and not shared between other adjacent memory levels according to a preferred embodiment of the present invention.
Figure 12B:
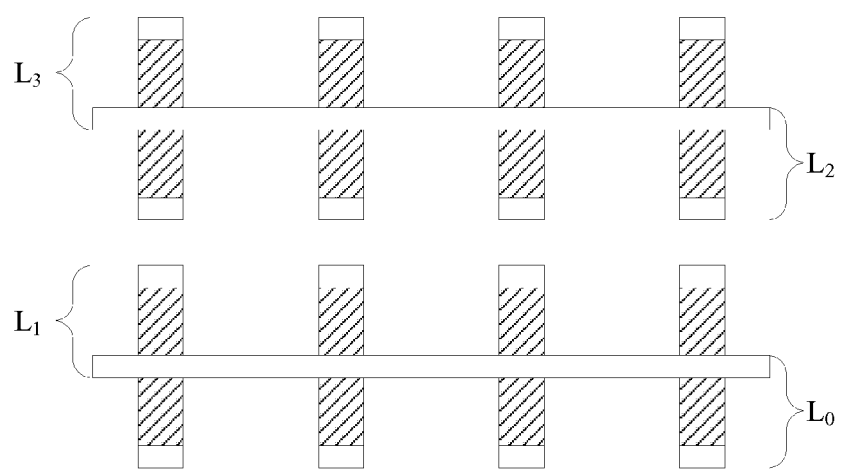
FIG. 12b is a cross-sectional view of such an array.

In another embodiment, some conductors may be shared while others are not. FIG. 12a shows a memory array in which conductors 400 are shared between memory levels $L_0$ and $L_1$, and conductors 600 are shared between memory levels $L_2$ and $L_3$. No conductors are shared between memory levels $L_1$ and $L_2$, however. FIG. 12b shows a cross-sectional view of such an array. Other configurations can be envisioned, and fall within the scope of the present invention.

Memory levels need not all be formed having the same style of memory cell. If desired, memory levels using phase change materials can alternate with memory levels using other types of memory cells.

Monolithic three dimensional memory array comprising vertically oriented pillars formed between conductors, the pillars comprising diodes, are described in Herner et al., U.S. patent application Ser. No. 10/326,470, "An Improved Method for Making High Density Nonvolatile Memory," filed Dec. 19, 2002, since abandoned; and Herner et al., U.S. patent application Ser. No. 10/955,549, "Nonvolatile Memory Cell Without a Dielectric Antifuse Having High- and Low-Impedance States," filed Sep. 29, 2004 (published as US 2005/0052915 on Mar. 10, 2005) both owned by the assignee of the present application and both hereby incorporated by reference. While the structure of the arrays just described diverges in some important ways from the structure of the array of these Herner et al. applications, wherever they are the same, the fabrication methods of the Herner et al. applications can be used. For clarity, not all of the fabrication details of these applications were included in this description, but no part of their description is intended to be excluded.

The photolithography techniques described in Chen, U.S. application Ser. No. 10/728,436, "Photomask Features with Interior Nonprinting Window Using Alternating Phase Shifting," filed Dec. 5, 2003 (issued as U.S. Pat. No. 7,172,840 on Feb. 6, 2007); or Chen, U.S. application Ser. No. 10/815,312, Photomask Features with Chromeless Nonprinting Phase Shifting Window," filed Apr. 1, 2004, (published as US 2005/0221200 on Oct. 6, 2005), both owned by the assignee of the present invention and hereby incorporated by reference, can advantageously be used to perform any photolithography step used in formation of a memory array according to the present invention.

To summarize, among the preferred embodiments described herein is a monolithic three dimensional phase change memory array comprising a) a first memory level, the first memory level comprising: i) a plurality of substantially parallel first conductors formed at a first height above a substrate; ii) a plurality of substantially parallel second conductors formed at a second height, the second height above the first height; iii) a plurality of first diodes, each disposed between one of the first conductors and one of the second conductors; iv) a plurality of heater layers, each disposed between one of the first conductors and one of the second conductors and each having an upper surface having a first area; v) a plurality of phase change elements, each having a lower surface having a second area, wherein at least part of the lower surface of each phase change element is in contact with the upper surface of the adjacent heater layer and wherein the first area is smaller than the second area; and b) at least a second memory level monolithically formed on the first memory level.

A method for forming a monolithic three dimensional phase change memory array according to the present invention comprises forming a plurality of substantially parallel, substantially coplanar first conductors at a first height above a substrate; forming a plurality of substantially parallel, substantially coplanar second conductors at a second height above the first height; forming a plurality of first diodes disposed between the first conductors and the second conductors, each first diode having a first average diode diameter; forming a plurality of heater elements, each heater element between one of the first diodes and one of the first conductors or one of the second conductors; forming a plurality of phase change elements, each in contact with one of the heater elements; forming a plurality of laterally etchable elements, each disposed above one of the first diodes, between the one of the first diodes and one of the second conductors; and laterally etching each of the laterally etchable elements wherein, after lateral etching, each laterally etchable element has an etched diameter less than the first average diode diameter of the first diode below it, wherein a phase change memory cell is formed between each of the first conductors and each of the second conductors.

A preferred embodiment comprises forming a plurality of substantially parallel, substantially coplanar first conductors at a first height above a substrate; depositing a semiconductor layerstack over the first conductors; depositing a heater layer on the semiconductor layerstack; forming a sacrificial layer on the heater layer; patterning and etching the sacrificial layer, heater layer, and semiconductor layer stack into first pillars, each first pillar comprising a) a first semiconductor diode etched from the semiconductor layer stack; b) a heater element etched from the heater layer, each heater element having a first diameter; and c) a sacrificial region etched from the sacrificial layer, each sacrificial region having a second diameter; further laterally and selectively etching each sacrificial region; filling gaps between the sacrificial regions with dielectric material; etching to remove the sacrificial regions, leaving voids in the dielectric material; and forming phase change elements, wherein a portion of each phase change element fills one of the voids; forming a plurality of substantially parallel, substantially coplanar second conductors above the first pillars.

Circuitry and Programming

To convert a chalcogenide in a crystalline, low-resistance state to an amorphous, high-resistance state, the chalcogenide must be brought to a high temperature, for example about 700 degrees C., then allowed to cool quickly. The reverse conversion from an amorphous, high-resistance state to a crystalline, low-resistance state is achieved by heating to a lower temperature, for example about 600 degrees C., then allowing the chalcogenide to cool relatively slowly. Circuit conditions must be carefully controlled in a monolithic three dimensional memory array formed according to the present invention to avoid inadvertent conversion of the chalcogenide of neighboring cells during programming of a cell, or during repeated read events.

Circuit structures and methods suitable for use in three dimensional memory arrays formed according to the present invention are described in Scheuerlein, U.S. patent application Ser. No. 10/403,844, "Word Line Arrangement Having Multi-Layer Word Line Segments for Three-Dimensional Memory Array," filed Mar. 31, 2003, (issued as U.S. Pat. No. 6,879,505 on Apr. 12, 2005) which is assigned to the assignee of the present invention and is hereby incorporated by reference. Beneficial elements of this arrangement include use of a common word line driver and very long bitlines allowing reduction in overhead circuitry.

Scheuerlein, US Pub. No. 2006/0157679, published Jul. 20, 2006, a related application filed on even date herewith, teaches a biasing scheme that could advantageously be used in an array formed according to the present invention. The biasing scheme of this application guarantees that the voltage across unselected and half-selected cells is not sufficient to cause inadvertent conversion of those cells, and allows precise control of the power delivered to the cell to be programmed.

The unprogrammed state of the cell may be the high-resistance, amorphous state, while the programmed state of the cell is the low-resistance, crystalline state, or vice versa. Programmed memory cells can all be returned to the unprogrammed state in a single erase event, or each cell can be programmed, then returned to an unprogrammed state individually.

Monolithic three dimensional memory arrays are described in Johnson et al., U.S. Pat. No. 6,034,882, "Vertically stacked field programmable nonvolatile memory and method of fabrication"; Johnson, U.S. Pat. No. 6,525,953, "Vertically stacked field programmable nonvolatile memory and method of fabrication"; Knall et al., U.S. Pat. No. 6,420,215, "Three Dimensional Memory Array and Method of Fabrication"; and Vyvoda et al., U.S. patent application Ser. No. 10/185,507, "Electrically Isolated Pillars in Active Devices," filed Jun. 27, 2002 (issued as U.S. Pat. No. 6,952,043 on Oct. 4, 2005); U.S. patent application Ser. No. 10/185,508, "Three Dimensional Memory," filed Jun. 27, 2002, (issued as U.S. Pat. No. 7,081,377 on Jul. 25, 2006) all assigned to the assignee of the present invention and all hereby incorporated by reference. Any of these various monolithic three dimensional memory arrays can be modified by the methods of the present invention to form nonvolatile memories having a reduced contact area between a phase change material and a heater layer.

The present invention has been described herein in the context of a monolithic three dimensional memory array formed above a substrate. Such an array comprises at least a first memory level formed at a first height above the substrate and a second memory level formed at a second height different from the first height. Three, four, eight, or indeed any number of memory levels can be formed above the substrate in such a multilevel array. Alternatively, a memory array comprising memory cells formed according to the present invention need not be formed in a three dimensional array, and could be a more conventional two dimensional array formed without stacking.

Other aspects of the cell could also be modified. The diode or MIM could be formed above the reduced-cross-section layer, for example.

Detailed methods of fabrication have been described herein, but any other methods that form similar structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A monolithic three dimensional phase change memory array comprising:
   a) a first memory level, the first memory level comprising:
      i) a plurality of substantially parallel first conductors formed at a first height above a substrate;
      ii) a plurality of substantially parallel second conductors formed at a second height, the second height above the first height;
      iii) a plurality of first diodes, each disposed between one of the first conductors and one of the second conductors;
      iv) a plurality of heater layers, each disposed between one of the first conductors and one of the second conductors and each having an upper surface having a first area;
      v) a plurality of phase change elements, each having a lower surface having a second area,
      wherein at least a part of the lower surface of each phase change element is in contact with the upper surface of the adjacent heater layer and
      wherein the first area is smaller than the second area; and
   b) at least a second memory level monolithically formed on the first memory level.

2. The monolithic three dimensional phase change memory array of claim 1 wherein the phase change elements comprise a chalcogenide material.

3. The monolithic three dimensional phase change memory array of claim 2 wherein the chalcogenide material comprises a GST material.

4. The monolithic three dimensional phase change memory array of claim 3 wherein the GST material comprises $Ge_2Sb_2Te_5$.

5. The monolithic three dimensional phase change memory array of claim 1 wherein the first diodes are p-i-n diodes.

6. The monolithic three dimensional phase change memory array of claim 5 wherein the first diodes reside in vertically oriented pillars.

7. The monolithic three dimensional phase change memory array of claim 1 wherein the substrate comprises monocrystalline silicon.

8. The monolithic three dimensional phase change memory array of claim 1 wherein the second conductors are substantially perpendicular to the first conductors.

9. The monolithic three dimensional phase change memory array of claim 1 wherein at least some of the first or second conductors comprise titanium tungsten or tungsten.

10. The monolithic three dimensional phase change memory array of claim 1 wherein the second memory level comprises a plurality of substantially parallel third conductors formed at a third height, the third height above the second height.

11. The monolithic three dimensional phase change memory array of claim 10 wherein the second memory level comprises a plurality of second diodes.

12. The monolithic three dimensional phase change memory array of claim 11 wherein the second memory level further comprises a plurality of substantially parallel fourth conductors formed at a fourth height, the fourth height above the third height.

13. The monolithic three dimensional phase change memory array of claim 12 wherein each of the second diodes is disposed between one of the third conductors and one of the fourth conductors.

14. The monolithic three dimensional phase change memory array of claim 11 wherein each of the second diodes is disposed between one of the second conductors and one of the third conductors.

* * * * *

UNITED STATES PATENT AND TRADEMARK OFFICE
CERTIFICATE OF CORRECTION

PATENT NO. : 7,351,992 B2  Page 1 of 1
APPLICATION NO. : 11/839490
DATED : April 1, 2008
INVENTOR(S) : Scheuerlein It is certified that error appears in the above-identified patent and that said Letters Patent is hereby corrected as shown below:

On title page Item (73) "Assignee", "SanDisk Corporation" should be -- SanDisk 3D LLC --

Signed and Sealed this

Fifth Day of January, 2010

David J. Kappos
*Director of the United States Patent and Trademark Office*